(12) United States Patent
Friedman et al.

(10) Patent No.: US 9,270,277 B2
(45) Date of Patent: Feb. 23, 2016

(54) EMITTER-COUPLED SPIN-TRANSISTOR LOGIC

(71) Applicant: Northwestern University, Evanston, IL (US)

(72) Inventors: Joseph S. Friedman, Rochester, NY (US); Gokhan Memik, Evanston, IL (US); Bruce W. Wessels, Wilmette, IL (US)

(73) Assignee: Northwestern University, Evanston, IL (US)

( * ) Notice: Subject to any disclaimer, the term of this patent is extended or adjusted under 35 U.S.C. 154(b) by 64 days.

(21) Appl. No.: 13/931,552

(22) Filed: Jun. 28, 2013

(65) Prior Publication Data

US 2014/0002137 A1    Jan. 2, 2014

Related U.S. Application Data

(60) Provisional application No. 61/665,728, filed on Jun. 28, 2012, provisional application No. 61/699,124, filed on Sep. 10, 2012.

(51) Int. Cl.

| | | |
|---|---|---|
| *H03K 19/084* | (2006.01) |
| *H03K 19/094* | (2006.01) |
| *H03K 19/086* | (2006.01) |
| *H01L 29/82* | (2006.01) |
| *H01L 29/66* | (2006.01) |
| *H01L 29/737* | (2006.01) |
| *H03K 19/082* | (2006.01) |

(52) U.S. Cl.
CPC ........ *H03K 19/082* (2013.01); *H01L 29/66984* (2013.01); *H01L 29/7371* (2013.01); *H01L 29/82* (2013.01); *H03K 19/086* (2013.01); *H03K 19/094* (2013.01)

(58) Field of Classification Search
CPC   H03K 19/084; H03K 19/0863; H03K 19/088
USPC .................................................... 326/48, 102
See application file for complete search history.

(56) References Cited

U.S. PATENT DOCUMENTS

| | | | | |
|---|---|---|---|---|
| 2002/0180480 A1* | 12/2002 | Dreps et al. | ..................... | 326/62 |
| 2006/0114018 A1* | 6/2006 | Sugahara et al. | ................ | 326/36 |
| 2010/0109710 A1* | 5/2010 | Morisson | ........................ | 327/94 |
| 2010/0231193 A1* | 9/2010 | Nascimento et al. | ......... | 323/315 |
| 2011/0279146 A1* | 11/2011 | Koo et al. | ..................... | 326/100 |
| 2013/0063178 A1 | 3/2013 | Friedman et al. | | |
| 2014/0002137 A1* | 1/2014 | Friedman et al. | ............. | 326/102 |

OTHER PUBLICATIONS

U.S. Appl. No. 61/559,499 "A Diode Logic Family and Applications of Same".

(Continued)

*Primary Examiner* — Dylan White
(74) *Attorney, Agent, or Firm* — Klintworth & Rozenblat IP LLC

(57) ABSTRACT

An emitter-coupled spin-transistor includes an emitter, a collector and a base. A first control wire receives an input current to create a magnetic field that affects amplification of the spin-transistor. A second transistor also includes an emitter, a collector and a base, where the emitter of the second transistor is coupled to the emitter of the spin-transistor to provide a logic circuit.

20 Claims, 6 Drawing Sheets

(56) References Cited

OTHER PUBLICATIONS

U.S. Appl. No. 61/498,998 "Magnetic Diode Based Programmable Logic".

U.S. Appl. No. 61/444,974 "Bipolar Magnetic Junction Transistor for Use in Memory, Information Processing and Magnetic Field Sensing".

* cited by examiner

EMITTER-COUPLED SPIN-TRANSISTOR LOGIC

CROSS-REFERENCE TO RELATED APPLICATIONS

This application claims the benefit of the filing date of U.S. Provisional Application No. 61/665,728, entitled "Emitter-Coupled Spin-Transistor Logic," filed on Jun. 28, 2012, and U.S. Provisional Application No. 61/699,124, entitled "Emitter-Coupled Spin-Transistor Logic," filed on Sep. 10, 2012, all of which are incorporated herein by reference.

This application also relies upon application Ser. No. 13/657,233, entitled "Logic Cells Based on Spin Diode and Applications of Same," filed on Oct. 22, 2013, which is incorporated herein by reference.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [17] represents the 17th reference cited in the reference list, namely, J. S. Friedman, Y. I. Ismail, G. Memik, A. V. Sahakian, and B. W. Wessels, "Emitter-coupled spin-transistor logic," IEEE/ACM International Symposium on Nanoscale Architectures, pp. 139-145, July 2012.

FIELD OF THE INVENTION

The present invention relates generally to emitter-coupled spin-transistor logic (ECSTL), and more particularly to cascaded logic circuits utilizing ECSTL.

BACKGROUND OF THE INVENTION

The ability to switch a logic gate through control of electron spin is the fundamental concept underlying spintronic logic circuits. By using electron spin along with charge, new avenues for manipulating signal flow become available [1]. It is therefore possible to develop logic devices with additional capabilities that are more efficient, leading to logic circuits with improved characteristics [2].

While electron spin has already found applications for computing in memory structures such as hard drives and magnetoresistive random-access memory (MRAM), the difficulty in cascading these devices has prevented its integration into logic structures. With the exception of the spin-diode logic family [3], the capability of driving the input of one spin-based logic gate with the output of a second spin-based logic gate has not been shown without requiring additional control logic. This ability to cascade gates is a fundamental requirement of logic circuits, and is a primary challenge for spin-based logic.

Originally, Datta and Das proposed a field effect transistor in which a gate voltage controls the spin-precession of electrons moving between the source and drain [4]. This work inspired the utilization of the spin degree of freedom, resulting in several distinct techniques. One prominent technique uses a current-carrying wire to create a magnetic field in a two-terminal device to switch between a conductive and resistive state. This technique has been suggested for logic based on magnetic tunnel junctions [5], [6] and magnetoresistive semiconductor heterojunctions [7], and is currently used in MRAM [2], [8]. Magnetic quantum cellular automata logic, in which localized spin states are used to control nearby spin states [9], [10], and magnetic domain-wall logic, in which a rotating magnetic field induces motion of magnetic domains in nanowires [11], are alternative techniques that have been demonstrated in circuits at room temperature. Logic based on spin accumulation [12], spin-wave phase [13], and spin-torque [14], [15], have also been proposed.

An unaddressed need exists in the art to address the deficiencies and inadequacies identified above.

SUMMARY OF THE INVENTION

One aspect consistent with the present invention is directed to a switch comprising a spin-transistor and a first control wire. The spin-transistor is configured so that when a magnetic field applied to the spin-transistor is less than a threshold value, the transistor is in a conductive state in which electric current flows through the spin-transistor. When the magnetic field applied to the spin-transistor is greater than the threshold value, the spin-transistor is in a resistive state in which the electric current flowing through the spin-transistor is substantially reduced. The first control wire is for receiving a current to affect the magnetic field applied to the spin-transistor.

Another aspect consistent with the present invention is directed to a switch comprising a spin-transistor and a first control wire for carrying a current to create a magnetic field that affects amplification of the spin-transistor.

A further aspect consistent with the present invention is directed to a logic circuit comprising a spin-transistor, a first control wire, a second transistor and three resistors. The spin-transistor has an emitter, a collector and a base. The first control wire is for receiving an input current to create a magnetic field that affects amplification of the spin-transistor. The second transistor has an emitter, a collector and a base, where the emitter of the second transistor is coupled to the emitter of the spin-transistor. The first resistor is between the spin-transistor collector and one of a low voltage source and a high voltage source. The second resistor is between the second transistor collector and the one of the low voltage source and the high voltage source. The third resistor is between the spin-transistor emitter and the other of the low voltage source and the high voltage source.

The cascading of logic gates is a critical challenge for the development of spintronic logic circuits. The present invention is directed to the first logic family exploiting magnetoresistive bipolar spin-transistors to achieve a complete spintronic logic family in which logic gates can be cascaded. This logic family, emitter-coupled spin-transistor logic (ECSTL), extends emitter-coupled logic (ECL) to spintronic devices and provides improved speed, area, and power characteristics. The advantages of the present invention are a result of the logic minimization permitted by the increased logical functionality of each ECSTL gate. This logic family achieves a power-delay product 10 to 25 times smaller than conventional ECL, inspiring a pathway for high-performance spintronic computing beyond 10 GHz.

Other systems, methods, features, and advantages of the present invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The accompanying drawings, which are incorporated in and constitute a part of this specification, illustrate an implementation of the present invention and, together with the description, serve to explain the advantages and principles of the invention. In the drawings.

DETAILED DESCRIPTION OF THE INVENTION

The present invention is directed to a very high-speed logic family exploiting a newly developed spintronic switch. The power dissipation of circuits made from this logic family is nearly independent of frequency, providing an advantage over CMOS for high-speed applications.

Figure 1:
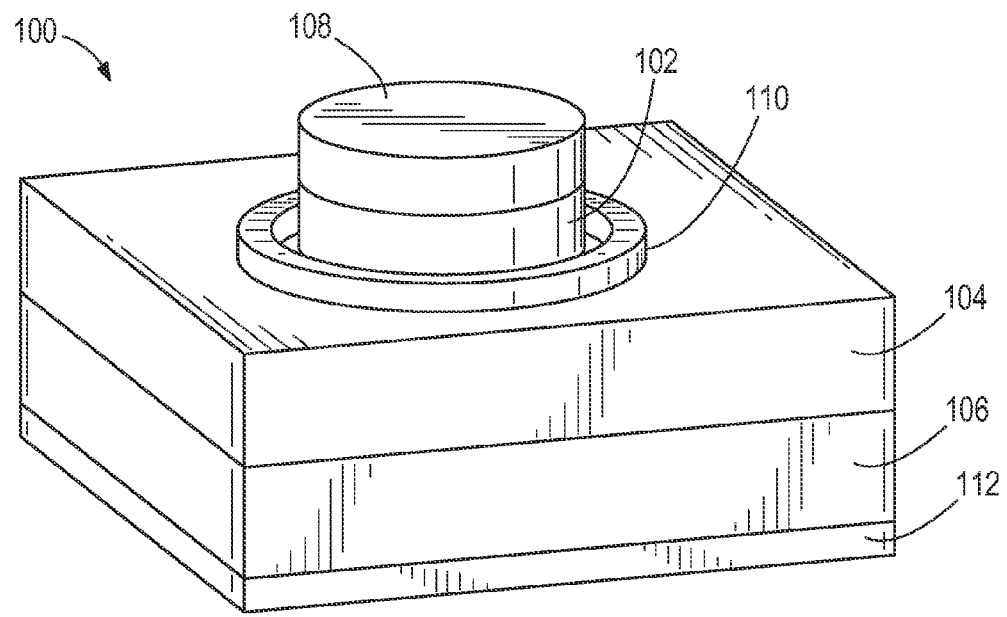
FIG. 1 depicts an exemplary magnetoresistive semiconductor heterojunction bipolar spin-transistor consistent with the present invention.
Figure 13:
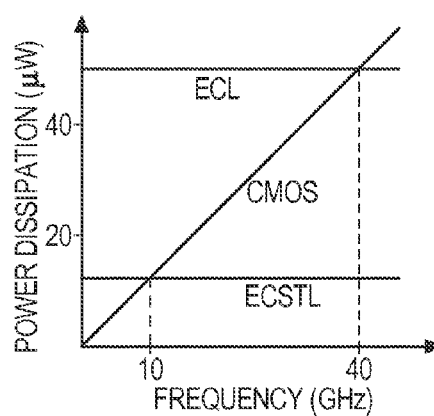
FIG. 13 compares the power dissipation in ECL and ECSTL logic families to CMOS circuits.

FIG. 1 depicts an exemplary magnetoresistive semiconductor heterojunction bipolar spin-transistor 100 consistent with the present invention. Although depicted as a pnp transistor, one having skill in the art will appreciate that the present invention can apply to any magnetoresistive amplifying device, such as a pnp or npn bipolar junction transistor, or an n-type or p-type metal-oxide-semiconductor field-effect transistor (MOSFET). As a three-terminal device designed for large signal amplification, the ability to exploit spin as an additional control allows for the modification and improvement of existing logic families [17]. Emitter-coupled logic (ECL), a bipolar junction transistor (BJT) family used in very high-speed electronics, can be modified and improved using spin-transistors. One having skill in the art will appreciate that the present invention can also apply to other types of transistor families, such as field-effect, semiconductor or other transistors. Circuits designed with ECL and the ECL-based logic families consistent with the present invention dissipate minimal dynamic power, causing the power dissipation to be nearly frequency-independent. As depicted in FIG. 13, this behavior is in contrast to CMOS circuits, in which dynamic power dissipation increases proportionally and deleteriously with frequency. The power dissipated by the emitter-coupled spin-transistor logic (ECSTL) family of the present invention is significantly less than ECL across all frequencies. This characteristic results in ECSTL dissipating less power than CMOS at frequencies above 10 GHz, making this logic family an effective technology for high-speed applications.

The improved characteristics of the logic family consistent with the present invention are derived from exploiting the magnetic characteristics of the spin-transistors. For example, ECSTL circuits consistent with the present invention route ECL differential amplifier currents to create magnetic fields that control the state of spin-transistors. This technique reduces current consumption, and allows for the logic stages to be cascaded similarly to conventional ECL circuits. A smaller number of stages and devices is required to implement logic functions, producing superior logic circuits in terms of speed, power, and area without any significant tradeoffs. The novelty of this logic family lies in the fact that it: (1) is the first logic family based on magnetoresistive semiconductor heterojunction spin-transistors; (2) has cascadable stages; (3) is based on high-speed ECL structures making use of the spin-degree of freedom; and (4) has the potential to make very high speed computing practical on a large scale.

The ECSTL logic family of the present invention utilizes magnetoresistive spin-transistors, which are notable for their large decrease in amplification under an externally applied magnetic field. Current-carrying control wires can be used to apply this magnetic field, thus controlling the state of the spin-transistors. The use of these structures in a modified ECL structure produces logic gates with exceptional functionality.

Conventional BJTs are formed by connecting two p-n junctions such that a cathode or anode is shared, forming a pnp or npn transistor, respectively. As discussed above, the pnp spin-transistor [16] is created by doping the emitter of a III-V transistor with Mn, as shown in FIG. 1. The spin-transistor 100 of FIG. 1 includes a p-type Mn-doped emitter 102, an n-type base 104, and a p-type collector 106, each of which has a respective contact 108, 110, 112. As discussed in [18], the base-emitter junction is magnetoresistive, while the base-collector junction behaves conventionally.

In a standard BJT, the relative voltages on the three terminals determine the bias of the two internal diodes, and therefore the region of operation of the transistor. As discussed above, although the description of the preferred embodiment refer to BJT-type spin-transistors, one having skill in the art will appreciate that the present invention can apply to other types of spin-transistors, such as field-effect, semiconductor or other transistors. When the base-emitter junction is forward-biased, a large current flows across this junction, which proceeds across the base-collector junction. In the spin-transistor, the presence of a magnetic field causes the base-emitter junction to become resistive, preventing current from flowing across the junction [18]. Therefore, in the presence of a magnetic field, a forward-biased base-emitter junction in the spin-transistor behaves similarly to a reverse-biased base-emitter junction in a conventional BJT. In both cases, the transistor will not produce large currents, and will remain cutoff rather than in the forward-active region. A more thorough discussion of the effect of a magnetic field on a spin-transistor can be found elsewhere [19]. The spin-transistor has the additional outstanding feature of a large magnetoresistance at room temperature.

Experimental data from the device presented in [16] shows a positive magnetoresistance in an InMnAs spin-transistor.

Figure 2:
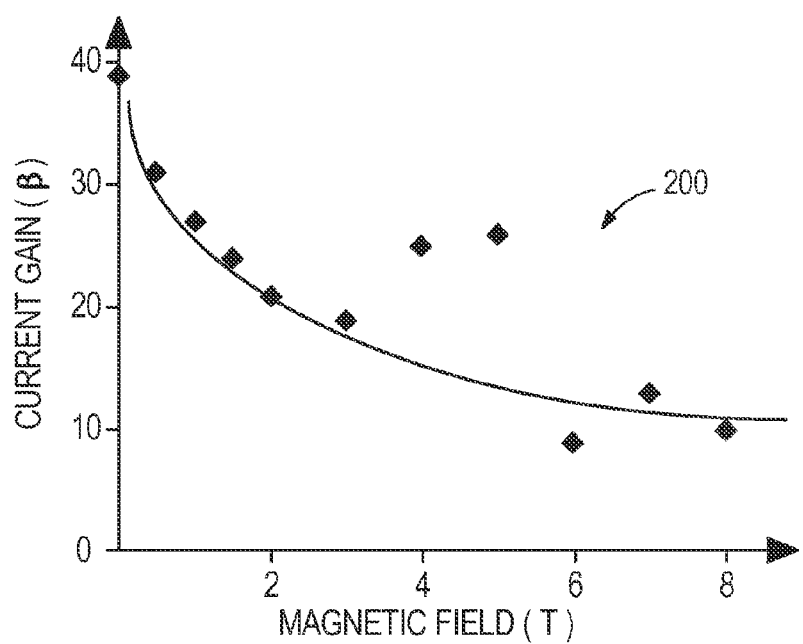
FIG. 2 illustrates how amplification of an exemplary spin-transistor decreases with increasing magnetic field.

One having skill in the art will appreciate that the present invention can also apply to any device exhibiting positive or negative magnetoresistance, in a paramagnetic or ferromagnetic manner. Positive magnetoresistance attenuates the current through the spin-transistor, causing the transistor to enter the cutoff region. In the room temperature data provided in FIG. 2, amplification decreases with increasing magnetic field. By optimizing the fabrication technique, it is possible to achieve much higher amplification in these spin-transistors, approaching those achieved with InAs by Wicks [20]. Additionally, by increasing the Mn concentration, it is possible to increase the giant magnetoresistance (GMR) of the junction, resulting in a greater change in amplification with magnetic field. It should be noted that the GMR increases with decreasing temperature, providing an even greater magnetoresistive effect at low temperatures. The characteristics of this exploratory spin-transistor demonstrate its suitability for advanced logic functionality.

One novel aspect of the present invention is directed to cascading spin-transistors to implement logical functions. As the flow of charged particles produces a magnetic field, a current flowing near a spin-transistor affects its amplification. A control wire alongside the base-emitter junction of a spin-transistor can therefore be exploited to perform logic [3].

Figure 3:
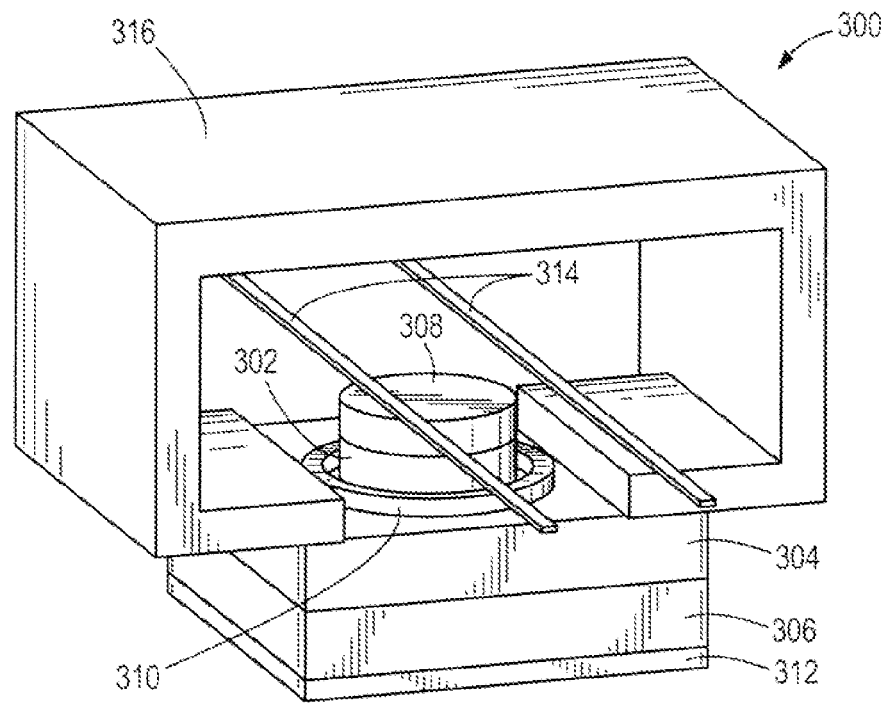
FIG. 3 depicts an exemplary magnetoresistive semiconductor heterojunction bipolar spin-transistor with control wires consistent with the present invention.

FIG. 3 depicts an exemplary magnetoresistive semiconductor heterojunction bipolar spin-transistor 300 consistent with the present invention. The spin-transistor 300 includes a p-type Mn-doped emitter 302, an n-type base 304, and a p-type collector 306, each of which has a respective contact 308, 310, 312. Metal wires 314 are placed parallel to the plane of the base-emitter junction, isolated by an insulator (not shown). These wires control the junction's magnetoresistive state, as the currents through the wires create magnetic fields perpendicular to the plane of the junction. Under zero or small net current, the junction is in its conductive state; a large net control current asserts the low-amplification resistive state. Depending upon the relative direction of the currents, the associated fields combine either constructively or destructively. If the currents in the two wires propagate in opposite directions, the fields will add, doubly suppressing the spin-transistor amplification; if the currents are in the same direction, the fields will cancel, allowing current to flow through the base-emitter junction.

While transistor-transistor logic (TTL) has been made largely obsolete by the superior characteristics of CMOS, ECL is the most effective logic family at high frequency. ECL consumes a relatively large amount of power, about 50 µW for a basic logic gate, but its small delay makes it useful for very high-speed applications [21], [22]. The power dissipation of ECL is roughly equivalent to CMOS power dissipation at 40 GHz, making ECL the preferred logic family for computing beyond 40 GHz, as depicted in FIG. 13.

Figure 4:
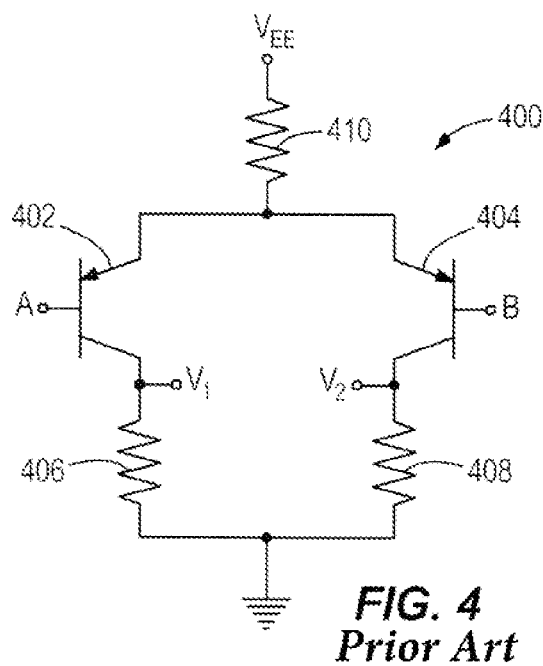
FIG. 4 depicts a conventional differential amplifier.

The fundamental building block of ECL, as well as ECSTL, is the differential amplifier 400 shown in FIG. 4. The differential amplifier 400 includes transistor 402 having a base connected to voltage input A, and transistor 404 having a base connected to voltage input B. The collector of transistor 402 is connected through resistor 406 to ground, while the collector of transistor 404 is connected through resistor 408 to ground. The emitters of transistors 402, 404 are connected through resistor 410 to voltage source $V_{EE}$. In this circuit, one transistor operates in the active region and the other transistor is in the cutoff region. The relative base voltages of the two transistors determine their states. Because the differential amplifier 400 is depicted using pnp transistors, the transistor with a lower base voltage is in the active region, and the transistor with the higher base voltage is in the cutoff region. If transistor 402 is cutoff and transistor 404 is in the active region, greater current passes through transistor 404 and resistor 408 than transistor 402 and resistor 406. There is therefore a greater voltage drop across resistor 408 than resistor 406, resulting in a high output voltage at $V_2$ and a low output voltage at $V_1$.

Figure 5:
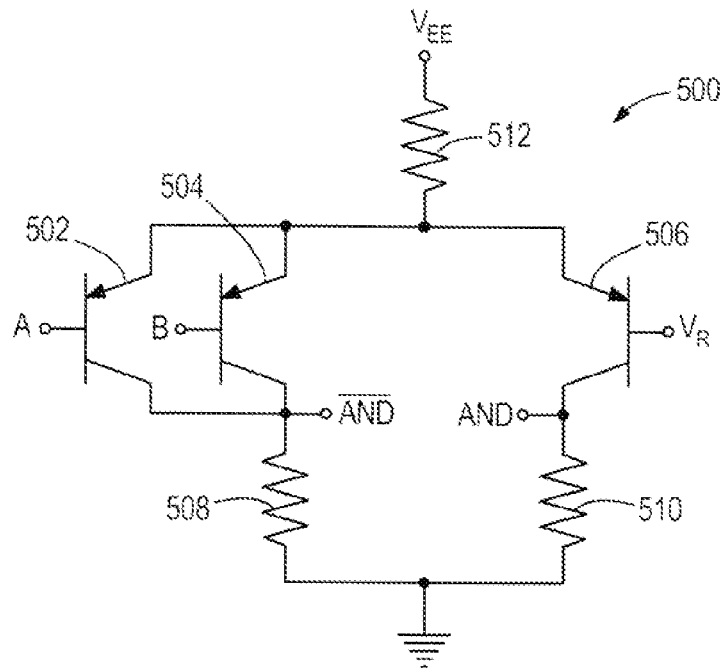
FIG. 5 depicts a conventional AND/NAND gate.

This differential amplifier is used with multiple inputs to form the ECL circuits. FIG. 5 depicts the logical gate that can be implemented with the fewest pnp transistors, i.e., an AND/NAND gate 500. AND/NAND gate 500 includes transistor 502 having a base connected to input A, transistor 504 having a base connected to input B, and transistor 506 having a base held at a constant voltage, $V_R$. The collectors of transistors 502 and 504 are connected through resistor 508 to ground, and the collector of transistor 506 is connected through resistor 510 to ground. The emitters of transistors 502, 504 and 506 are connected through resistor 512 to voltage source $V_{EE}$. AND/NAND gate 500 serves as the basis ECL function.

AND/NAND gate 500 accepts two (or more) inputs, A and B, and produces two outputs, the logical AND and ⌐ AND of the inputs. Because the base of transistor 506 is held at a constant voltage, $V_R$ transistor 506 will switch between the active and cutoff regions depending on the behavior of the rest of the circuit. If either or both of the inputs are '0,' the corresponding input transistor 502 or 504 is in the active region, and transistor 506 is cutoff. There is therefore a large current through resistor 508 and a small current through resistor 510, causing, respectively, large and small voltage drops across those resistors. Therefore, the ⌐ AND output is '1' and the AND output is '0.' If both inputs are '1,' transistor 506 is in the active region and both transistor 502 and 504 are cutoff, resulting in an AND output of '1' and ⌐ AND output of '0.'

The spin-transistors and control wires discussed above can be used to create a modified logic family based on ECL, i.e., ECSTL. This novel logic family of the present invention replaces the standard BJTs with spin-transistors and adds control wires as additional inputs. It is therefore possible to realize more complex logical functions without adding any additional circuitry.

As discussed above, for a spin-transistor electrically biased in the forward-active region, the presence of a magnetic field causes the base-emitter junction to become resistive. This, in turn, causes the spin-transistor to function similarly to a cutoff transistor, and minimal current flows from the emitter to the collector.

Control wires determine the spin-transistor region of operation, as listed in Table I below. With a sufficient positive difference between the emitter and collector voltages, the spin-transistor is in the active region if the base voltage is low and the control wires produce zero net field through the transistor. This condition can be imposed either by zero current on both of the control wires or by equal and opposite fields produced by the two control wires. In the case of a high base voltage or of a large net magnetic field, the spin-transistor is in the cutoff region.

TABLE I

Spin-Transistor Regions of Operation

| Base Voltage | Control Wire 1 | Control Wire 2 | Transistor State |
|---|---|---|---|
| Low | 0 | 0 | Active |
| Low | 0 | +I | Cutoff |
| Low | 0 | −I | Cutoff |
| Low | +I | 0 | Cutoff |
| Low | +I | +I | Cutoff |
| Low | +I | −I | Active |
| High | X | X | Cutoff |

The ECSTL family of the present invention is a modified ECL structure in which standard BJTs are replaced by spin-transistors and the currents in the differential amplifiers are routed through the control wires of other transistors. The current through resistor 508 or 510 in the AND/NAND gate 500 of FIG. 5 is routed near a spin-transistor to create an additional control signal for the spin-transistor. The differential pair amplifies the difference between the inputs of the bases; there is a large ratio of current through the active transistor relative to the cutoff transistor. This large current ratio allows for a clear differentiation between a large and small magnetic field, within the tolerances of the spin-transistor magnetoresistance.

The additional inputs to the spin-transistors allow for the compact evaluation of complex logic functions. The ability to perform a three-input logical function within a single transistor makes possible significantly more complex functions within a single stage of logic. The use of control wires does not imply the flow of additional current, as the control wire currents are already necessary for the differential amplifier and are simply rerouted to control the spin-transistors. However, the routing of the various wires in the circuit is significantly more complex than in standard ECL.

Current is an ECSTL state variable in addition to voltage. Each logic gate accepts voltage and current inputs and produces voltage and current outputs. The currents are either large or small, a '1' or '0,' respectively. These currents are used in the control wires of the spin-transistors and are proportional to a magnetic field [3]. In order to match the experimental data and conventional ECL quantities, conservative '1' values of 5 T and 1.3 V are chosen, along with '0' values of 0 T and 0.7 V. Optimized ECSTL devices and circuits should enable decreased current, voltage, and magnetic field, significantly reducing power consumption.

Figure 6:
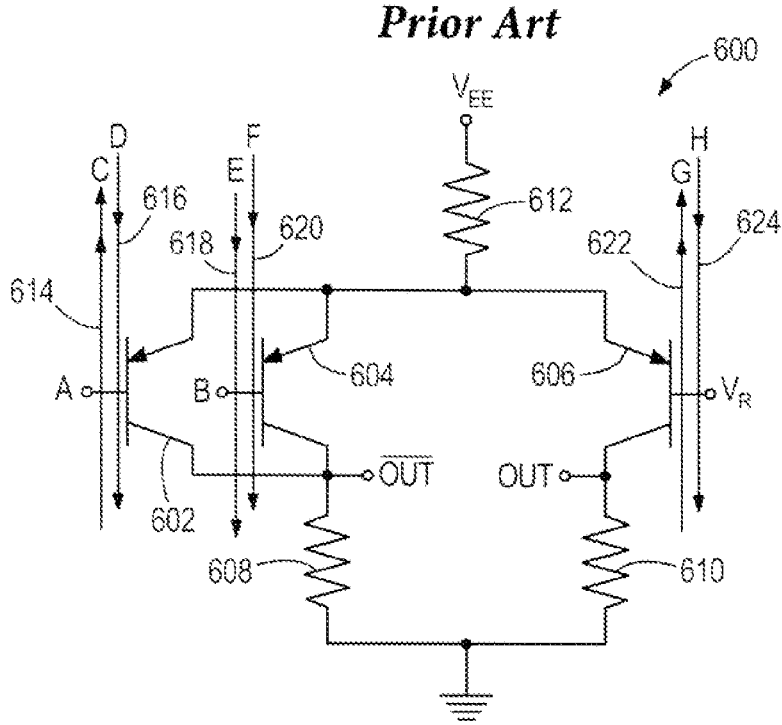
FIG. 6 depicts an exemplary emitter-coupled spin-transistor logic ("ECSTL") basis logic gate consistent with the present invention.

FIG. 6 depicts the general ECSTL basis gate 600 in accordance with the present invention, from which any logical function may be derived. Gate 600 includes spin-transistor 602 having a base connected to input voltage A, spin-transistor 604 having a base connected to input voltage B, and spin-transistor 606 having a based held at constant voltage $V_R$. The collectors for spin-transistors 602 and 604 are connected through resistor 608 to ground, while the collector for spin-transistor 606 is connected through resistor 610 to ground. The emitters for spin-transistors 602, 604 and 606 are connected through resistor 612 to voltage source $V_{EE}$. Spin-transistor 602 is depicted with two control wires 614, 616 having current inputs C and D, spin-transistor 604 is depicted with two control wires 618, 620 having current inputs E and F, and spin-transistor 606 is depicted with two control wires 622, 624 having current inputs G and H. Although gate 600 is depicted with two spin-transistors, one having skill in the art will appreciate that the logic circuits consistent with the present invention may only have one spin-transistor, or multiple spin transistors. Also, although each spin-transistor is depicted with two control wires, one having skill in the art will appreciate that the spin-transistors included in the logic circuits consistent with the present invention may only have one control wire, or multiple control wires. In addition, the currents through each control wire may flow in either direction, and are not limited to those illustrated in FIG. 6.

As shown, the gate 600 in FIG. 6 includes two voltage inputs, A & B, and six current inputs, C-H, for a total of eight inputs. The presence of a net current through the control wires forces the spin-transistor into the cutoff region. A cutoff transistor has a large collector-emitter impedance, and therefore directs current elsewhere in the circuit. Each spin-transistor can perform a three-input logic computation. This structure permits the computation of more complex logic within a single stage without requiring additional transistors. As each stage requires the same amount of current, the use of fewer stages implies less current flow. Since fewer transistors are required to perform a logic function, there is increased circuit efficiency in terms of power dissipation, propagation delay, and physical area.

The logic family of the present invention can be used to design highly compact circuits, and these logic gates can be cascaded to perform any logical function. For example, current flowing through resistor 406 or resistor 408 in differential amplifier 400 of FIG. 4 may be used to provide the current input for a spin-transistor control wire. FIGS. 7 and 10-12 illustrate sample complex logic circuits consistent with the present invention.

The functionality of these circuits has been verified to ensure suitable cascading characteristics. Simulations based on the models discussed in [17] have been performed using Synopsis HSPICE [23]. These simulations demonstrate the ability to create large-scale integrated ECSTL circuits. As the magnetic field magnitudes bear a more direct relation to the spin-transistor models than the current magnitudes, the input and output values of the gates are discussed in terms of magnetic fields and voltages rather than currents and voltages.

Figure 7:
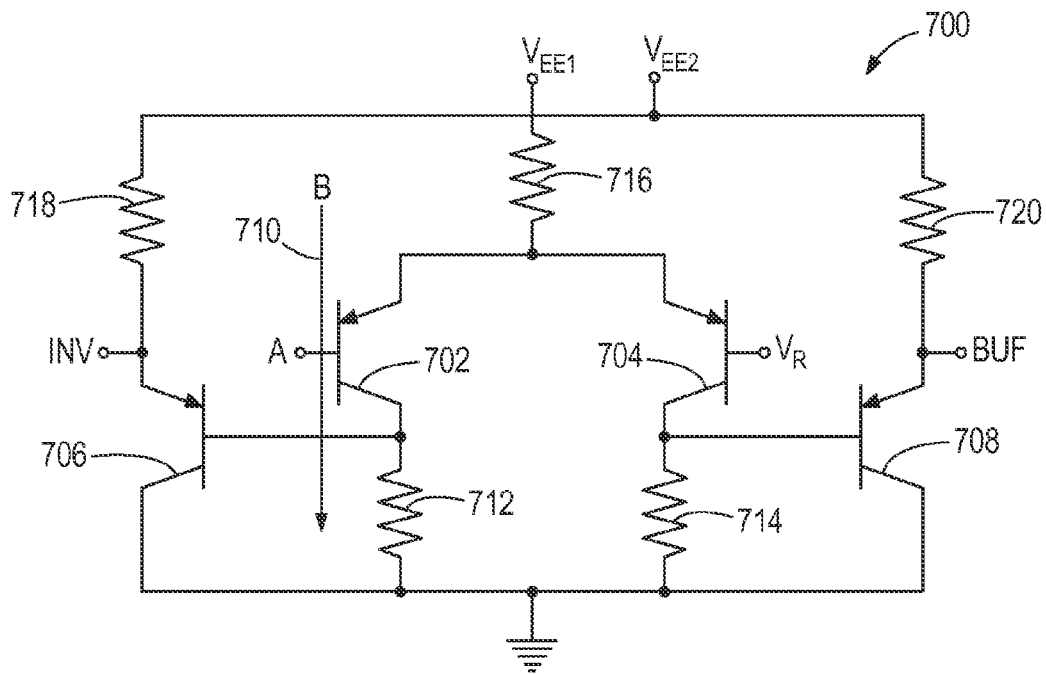
FIG. 7 depicts an exemplary ECSTL inverter/buffer circuit with voltage followers, consistent with the present invention.

The simplest circuit demonstrating the principles of ECSTL is the inverter/buffer 700 depicted in FIG. 7. Inverter/buffer 700 includes spin-transistor 702, reference transistor 704, inverter transistor 706 and buffer transistor 708. Spin-transistor 702 has a base connected to voltage input A and a control wire 710 having a current input B. The collector for spin-transistor 702 provides the voltage input to the base of inverter transistor 706, and is connected through resistor 712 to ground. The collector for reference transistor 704 provides the voltage input to the base of buffer transistor 708, and is connected through resistor 714 to ground. The emitters for spin-transistor 702 and reference transistor 704 are connected through resistor 716 to voltage source $V_{EE}$. The emitter for inverter transistor 706 is connected through resistor 718 to voltage source $V_{EE}$, and the emitter for buffer transistor 708 is connected through resistor 720 to voltage source $V_{EE}$.

In the absence of a magnetic field, the circuit functions as a conventional differential amplifier. If input A is a low voltage and B produces a small field, spin-transistor 702 is in the active region, and draws more current than reference transistor 704. The current through resistor 716 is therefore directed through resistor 712, resulting in a '1' current through resistor 712 and a '0' current through resistor 714. These currents produce a large voltage on the base of inverter transistor 706 and a small voltage on the base of buffer transistor 708. A '1' voltage is therefore propagated to the INV output and a '0' voltage is propagated to the BUF output. If there is a large current on the B input, spin-transistor 702 is cutoff. The current therefore flows through resistor 714 and produces opposite values for the output voltages and currents. The outputs are similar if A is a large voltage. This circuit therefore selectively performs the inverter/buffer function.

Figure 8:
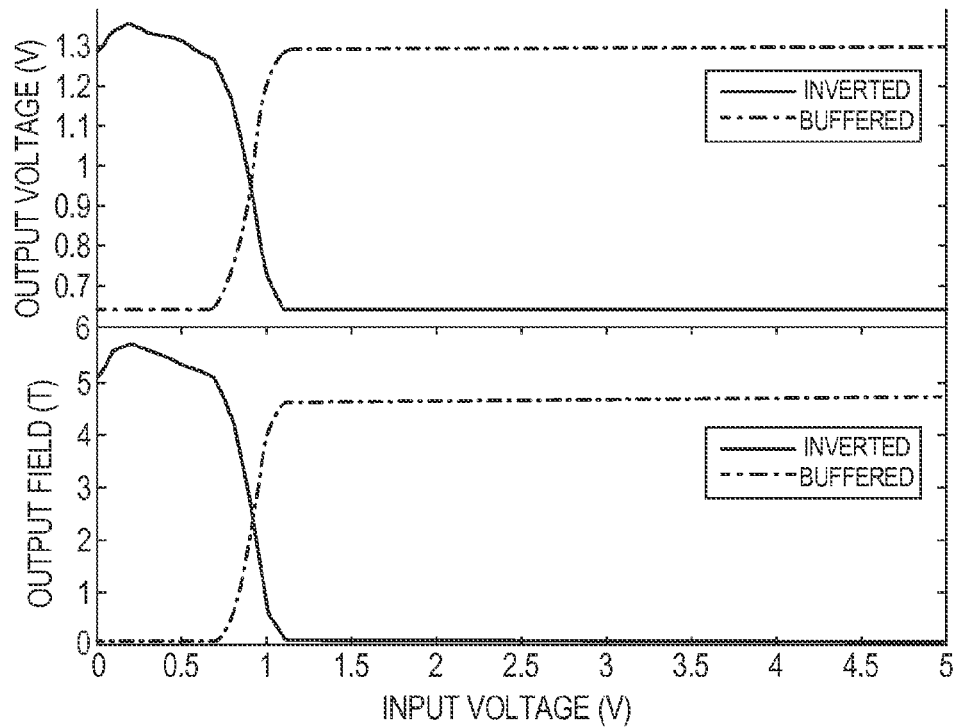
FIG. 8 depicts the voltage transfer characteristics for the ECSTL inverter/buffer circuit of FIG. 7.

While conventional electronic circuits are generally analyzed with a voltage transfer characteristic, the use of current/field outputs and inputs necessitates a more complex analysis. FIG. 8 is a voltage transfer characteristic showing the switching of the circuit's outputs in response to changing the input voltage A. In this simulation, the magnetic field input B is held constant at 0 T in order to isolate the effects of the voltage input. As the spin-transistors are not affected by a magnetic field, this circuit functions similarly to a conventional ECL inverter/buffer. When the input voltage is 0 V, the inverted output voltage and field is high and the buffered outputs are low. At slightly higher input voltages, the inverted outputs reach a peak voltage as occurs in conventional ECL [24]. When the input voltage is equal to the reference voltage, the inverted and buffered outputs are equivalent. Finally, a large input voltage results in '0' inverted outputs and '1' buffered outputs.

Figure 9:
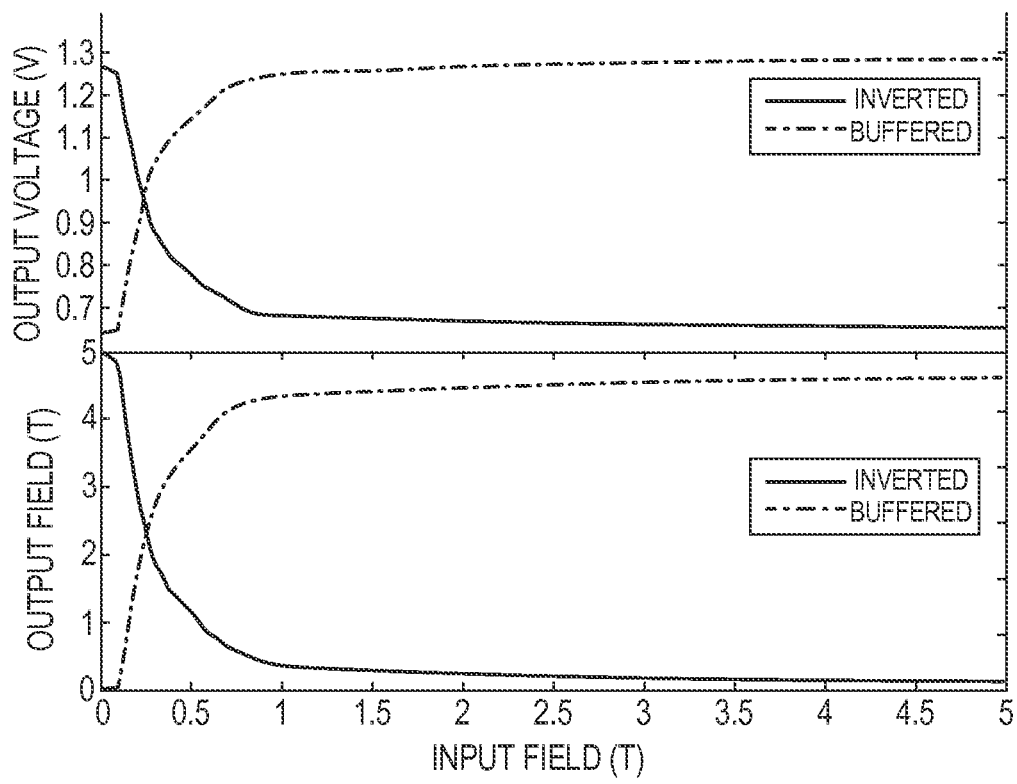
FIG. 9 depicts the field transfer characteristic for the ECSTL inverter/buffer circuit of FIG. 7.

The response to a changing input magnetic field is shown in the field transfer characteristic of FIG. 9. With the input voltage A held constant at 0.7 V, the input field B is varied from 0 T to 5 T. As B increases, the magnetoresistive properties of the spin-transistors force spin-transistor 702 into the cutoff region, causing current to flow through resistor 714. This results in a monotonic decrease in the inverted output magnitudes, and a monotonic increase in the buffered magnitudes.

One example of the compactness of ECSTL is that multiplexer circuits can be reduced to a single stage of logic. Specific implementations of the general circuit 600 depicted in FIG. 6 are discussed below which perform multiplexing functions. These multiplexer circuits are far more compact than conventional ECL multiplexer circuits, which require multiple stages of logic and at least 20 transistors. These circuits are also more compact than standard CMOS circuits, which require twelve transistors and two stages, and are comparable to CMOS transmission gate multiplexers, which represent one of the greatest strengths of CMOS [25].

Figure 10:
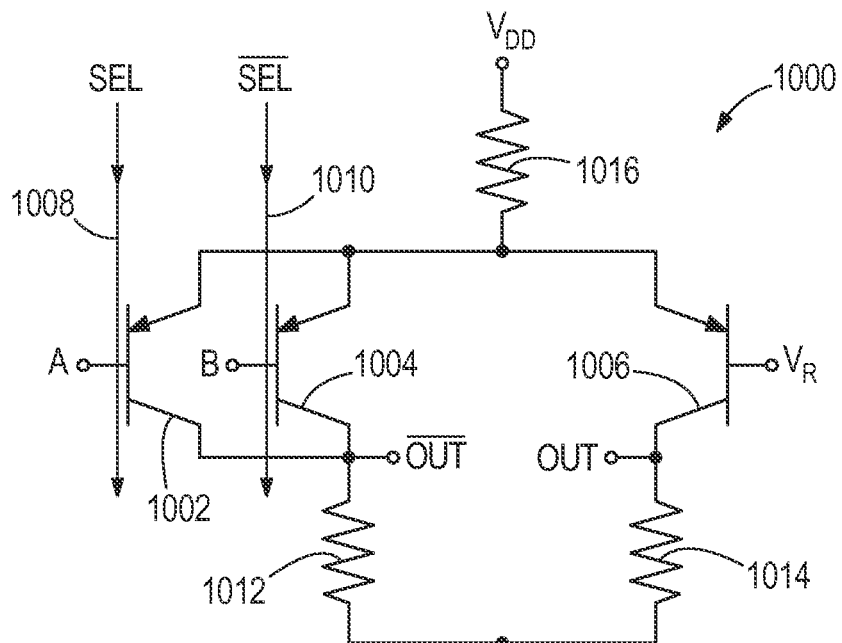
FIG. 10 depicts an exemplary ECSTL 2:1 multiplexer consistent with the present invention.

FIG. 10 depicts a 2:1 multiplexer 1000 consistent with the present invention. Multiplexer 1000 includes spin-transistors 1002, 1004 and reference transistor 1006. Spin-transistor 1002 has a base connected to voltage input A and a control wire 1008 having a current input Sel. Spin-transistor 1004 has a base connected to voltage input B and a control wire 1010 having current input ⌐Sel. The collectors for spin-transistors 1002, 1004 are connected through resistor 1012 to ground. Reference transistor 1006 has a base connected to a constant voltage source $V_R$. The collector for reference transistor 1006 is connected through resistor 1014 to ground. The emitters for spin-transistors 1002, 1004 and reference transistor 1006 are connected through resistor 1016 to voltage source $V_{DD}$.

In 2:1 multiplexer 1000, when the Sel wire carries current, spin-transistor 1002 is in the cutoff region. When Sel does not carry current, the ⌐Sel wire carries current, causing spin-transistor 1004 to be cutoff. Thus, Sel chooses which spin-transistor 1002, 1004 responds to its input. The correct signal is propagated to the output in both inverted and non-inverted forms.

Figure 11:
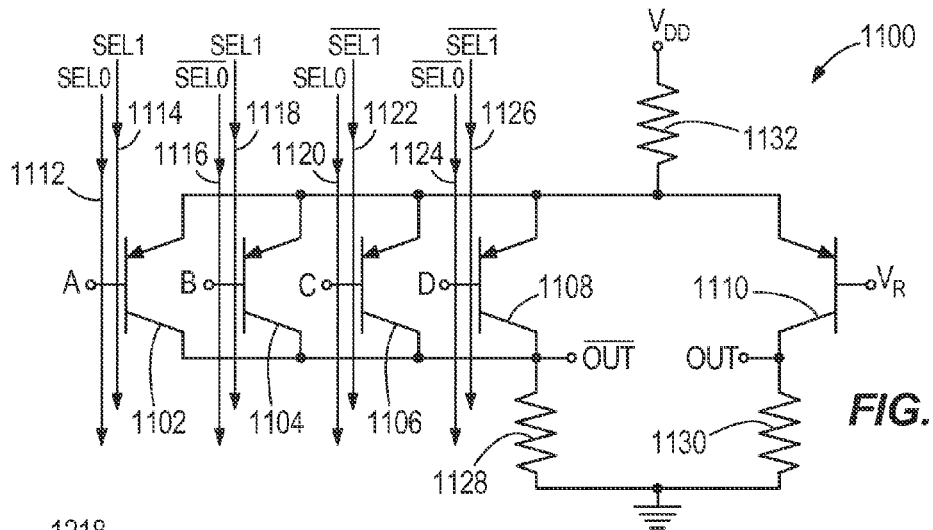
FIG. 11 depicts an exemplary ECSTL 4:1 multiplexer consistent with the present invention.

FIG. 11 depicts a 4:1 multiplexer 1100 consistent with the present invention. Multiplexer 1100 includes four spin-transistors 1102, 1104, 1106, 1108 and a reference transistor 1110. Spin-transistor 1102 has a base connected to voltage input A and two control wires 1112, 1114, where control wire 1112 receives current input Sel0 and control wire 1114 receives current input Sel1. Spin-transistor 1104 has a base connected to voltage input B and two control wires 1116, 1118, where control wire 1116 receives current input ⌐Sel0 and control wire 1118 receives current input Sel1. Spin-transistor 1106 has a base connected to voltage input C and two control wires 1120, 1122, where control wire 1120 receives current input Sel0 and control wire 1122 receives current input ⌐Sel1. Spin-transistor 1108 has a base connected to voltage input D and two control wires 1124, 1126, where control wire 1124 receives current input ⌐Sel0 and control wire 1126 receives current input ⌐Sel1. The collectors for spin-transistors 1102, 1104, 1106, 1108 are connected through resistor 1128 to ground. Reference transistor 1110 has a base connected to a constant voltage source $V_R$ and a collector connected through resistor 1130 to ground. The emitters for spin-transistors 1102, 1104, 1106, 1108 and the emitter for reference transistor 1110 are connected through resistor 1132 to voltage source $V_{DD}$.

The control wires 1112-1126 in 4:1 multiplexer 1100 implement a NOR function to select the spin-transistor 1102-1108 in operation. If either of a spin-transistor's control wires carries current, that spin-transistor is cutoff. Therefore, exactly one spin-transistor is in operation at all times, and the selected input is propagated to the output along with its complement.

HSPICE simulations have been performed on the 2:1 multiplexer 1100 shown in FIG. 10. As listed in Table II below, each state is characterized by a voltage and a magnetic field. The simulations show correct outputs that are clearly identifiable as a '1' or '0,' although different combinations of inputs produce slightly different output voltages. These slight variations are due to the presence of multiple active input transistors resulting in a stronger signal than is caused by a single active input.

TABLE II

Multiplexer Input/Output Voltages and Fields

| Sel | ⌐Sel | A | ⌐A | B | ⌐B | Out | ⌐Out |
|---|---|---|---|---|---|---|---|
| 0.7 V | 1.2 V | 0.7 V | 1.2 V | 0.7 V | 1.2 V | 0.64 V | 1.28 V |
| 0 T | 5 T | 0 T | 5 T | 0 T | 5 T | 0.02 T | 5 T |
| 0.7 V | 1.2 V | 0.7 V | 1.2 V | 1.2 V | 0.7 V | 0.64 V | 1.28 V |
| 0 T | 5 T | 0 T | 5 T | 5 T | 0 T | 0.02 T | 5 T |
| 0.7 V | 1.2 V | 1.2 V | 0.7 V | 0.7 V | 1.2 V | 1.28 V | 0.65 V |
| 0 T | 5 T | 5 T | 0 T | 0 T | 5 T | 4.56 T | 0.12 T |
| 0.7 V | 1.2 V | 1.2 V | 0.7 V | 1.2 V | 0.7 V | 1.3 V | 0.64 V |
| 0 T | 5 T | 5 T | 0 T | 5 T | 0 T | 4.66 T | 0.02 T |
| 1.2 V | 0.7 V | 0.7 V | 1.2 V | 0.7 V | 1.2 V | 0.64 V | 1.28 V |
| 5 T | 0 T | 0 T | 5 T | 0 T | 5 T | 0.02 T | 5 T |
| 1.2 V | 0.7 V | 0.7 V | 1.2 V | 1.2 V | 0.7 V | 1.28 V | 0.65 V |
| 5 T | 0 T | 0 T | 5 T | 5 T | 0 T | 4.56 T | 0.12 T |
| 1.2 V | 0.7 V | 1.2 V | 0.7 V | 0.7 V | 1.2 V | 0.64 V | 1.28 V |
| 5 T | 0 T | 5 T | 0 T | 0 T | 5 T | 0.02 T | 5 T |
| 1.2 V | 0.7 V | 1.2 V | 0.7 V | 1.2 V | 0.7 V | 1.3 V | 0.64 V |
| 5 T | 0 T | 5 T | 0 T | 5 T | 0 T | 4.66 T | 0.02 T |

Figure 12:
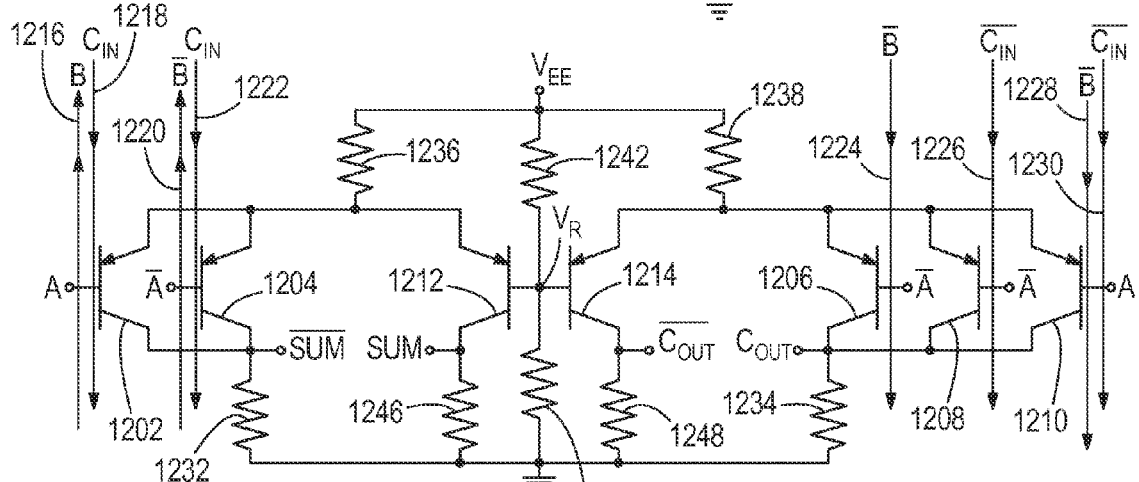
FIG. 12 depicts an exemplary ECSTL full adder consistent with the present invention.

FIG. 12 depicts a full adder 1200 consistent with the present invention. Full adder 1200 includes seven spin-transistors 1202-1214. Spin-transistor 1202 has a base connected to voltage input A and two control wires 1216, 1218, where control wire 1116 receives current input B and control wire 1218 receives current input $C_{IN}$. Spin-transistor 1204 has a base connected to voltage input ⌐A and two control wires 1220, 1222, where control wire 1220 receives current input ⌐B and control wire 1222 receives current input $C_{IN}$. Spin-transistor 1206 has a base connected to voltage input ⌐A and one control wire 1224 that receives current input ⌐B. Spin-transistor 1208 has a base connected to voltage input ⌐A and one control wires 1226 that receives current input ⌐$C_{IN}$. Spin-transistor 1210 has a base connected to voltage input A and two control wires 1228, 1230, where control wire 1228 receives current input ⌐B and control wire 1230 receives current input ⌐$C_{IN}$. The collectors for spin-transistors 1202, 1204 are connected through resistor 1232 to ground, and the collectors for spin-transistors 1206, 1208, 1210 are connected through resistor 1234 to ground. The bases for reference transistors 1212, 1214 are connected to constant voltage source $V_R$, and through resistor 1240 to ground and resistor 1242 to voltage source $V_{EE}$. The collector for reference transistor 1212 is connected through resistor 1246 to ground, and the collector for reference transistor 1214 is connected through resistor 1248 to ground. The emitters for spin-transistors 1202, 1204 and the emitter for reference transistor 1212 are connected through resistor 1236 to voltage source $V_{EE}$. The emitters for spin-transistors 1206, 1208, 1210 and the emitter for reference transistor 1214 are connected through resistor 1238 to voltage source $V_{EE}$.

Full adder 1200 contains two distinct sections, one each for the Sum and $C_{OUT}$ logic. The functions have been specifically optimized for ECSTL using De Morgan's Laws:

$$C_{OUT} = (A \wedge B) \vee (A \wedge C_{IN}) \vee (B \wedge C_{IN}) \quad (1a)$$
$$= (A \wedge B) \vee (A \wedge C_{IN}) \vee \overline{(\overline{A} \wedge \overline{B \vee C_{IN}})} \quad (1b)$$

$$\text{Sum} = A \oplus B \oplus C_{IN} = \overline{\overline{A} \wedge \overline{B \oplus C_{IN}}} \vee (A \wedge \overline{B \oplus C_{IN}}). \quad (2)$$

In the center of the circuit, a voltage divider sets a reference voltage $V_R$ for the two reference transistors 1212, 1214.

For the Sum logic, the control wires carry current in opposite directions, and therefore implement the XOR function. Spin-transistor 1202 is in the active region when both A and $B \oplus C_{IN}$ are '0,' and is otherwise cutoff. Spin-transistor 1204 is in the active region when A is '1' and $\overline{B \oplus C_{IN}}$ is '0.' If either or both spin-transistor 1202 or spin-transistor 1204 are in the active region, significant current flows through resistor 1232. This current causes ⌐Sum to reach a high voltage, and Sum a low voltage.

The logic for $C_{OUT}$ and ⌐$C_{OUT}$ functions similarly. The operating regions of spin-transistors 1206, 1208, 1210 depend upon the adder inputs. If at least one of these transistors is in the active region, current is diverted from resistor 1248. There is therefore a large current through resistor 1234 with a corresponding voltage drop across resistor 1234, resulting in a '1' output for $C_{OUT}$. If all of the input transistors are cutoff, reference transistor 1214 is in the active region and current flows through resistor 1248, resulting in a '1' output for ⌐$C_{OUT}$.

This full adder is unique in its use of only a single stage of logic to produce all of the outputs. As each stage of logic adds to a signal's propagation time, the use of a single stage provides exceptional speed characteristics. It is also compact, using only 7 spin-transistors. This circuit compares favorably to a standard ECL full adder, which requires 24 transistors, and the CMOS version, which requires 28 transistors. In addition, both of these conventional circuits require multiple stages of logic, limiting circuit speed. ECSTL therefore provides circuits with higher performance while also dissipating less power and using less area.

Simulations have also been performed on the full adder shown in FIG. 12. As above, there are variations between '0' and '1' values, but there is clear differentiation between the two binary states. This can be seen in Table III below, where the voltage and field inputs are shown in relation to the outputs.

TABLE III

Full Adder Input/Output Voltages and Fields

| A | ⌐A | B | ⌐B | $C_{IN}$ | ⌐$C_{IN}$ | Sum | ⌐Sum | $C_{OUT}$ | ⌐$C_{OUT}$ |
|---|---|---|---|---|---|---|---|---|---|
| 0.7 V | 1.2 V | 0.7 V | 1.2 V | 0.7 V | 1.2 V | 0.66 V | 1.23 V | 0.64 V | 1.29 V |
| 0 T | 5 T | 0 T | 5 T | 0 T | 5 T | 0.15 T | 4.55 T | 0.05 T | 4.61 T |
| 0.7 V | 1.2 V | 0.7 V | 1.2 V | 1.2 V | 0.7 V | 1.28 V | 0.65 V | 0.65 V | 1.28 V |
| 0 T | 5 T | 0 T | 5 T | 5 T | 0 T | 4.55 T | 0.11 T | 0.12 T | 4.54 T |
| 0.7 V | 1.2 V | 1.2 V | 0.7 V | 0.7 V | 1.2 V | 1.28 V | 0.65 V | 0.65 V | 1.28 V |
| 0 T | 5 T | 5 T | 0 T | 0 T | 5 T | 4.55 T | 0.11 T | 0.13 T | 4.53 T |
| 0.7 V | 1.2 V | 1.2 V | 0.7 V | 1.2 V | 0.7 V | 0.64 V | 1.27 V | 1.27 V | 0.64 V |
| 0 T | 5 T | 5 T | 0 T | 5 T | 0 T | 0.03 T | 5 T | 5 T | 0.04 T |
| 1.2 V | 0.7 V | 0.7 V | 1.2 V | 0.7 V | 1.2 V | 1.28 V | 0.65 V | 0.66 V | 1.26 V |
| 5 T | 0 T | 0 T | 5 T | 0 T | 5 T | 4.55 T | 0.11 T | 0.24 T | 4.43 T |
| 1.2 V | 0.7 V | 0.7 V | 1.2 V | 1.2 V | 0.7 V | 0.64 V | 1.27 V | 1.27 V | 0.64 V |
| 5 T | 0 T | 0 T | 5 T | 5 T | 0 T | 0.03 T | 5 T | 5 T | 0.04 T |
| 1.2 V | 0.7 V | 1.2 V | 0.7 V | 0.7 V | 1.2 V | 0.66 V | 1.23 V | 1.28 V | 0.64 V |
| 5 T | 0 T | 5 T | 0 T | 0 T | 5 T | 0.15 T | 4.55 T | 5.01 T | 0.04 T |
| 1.2 V | 0.7 V | 1.2 V | 0.7 V | 1.2 V | 0.7 V | 1.28 V | 0.65 V | 1.28 V | 0.64 V |
| 5 T | 0 T | 5 T | 0 T | 5 T | 0 T | 4.55 T | 0.11 T | 5.05 T | 0.04 T |

Adapted from [26], the primary computing metrics are power, performance, area, operating temperature, scalability, and cascading characteristics. Economic factors such as yield, cost, and reliability are also important. To be effective for general-purpose computing, a logic family preferably exhibits good characteristics for all of these metrics. As mentioned above, cascading and room temperature operation are significant challenges facing spintronic computing.

The primary mechanism for power dissipation in ECL and ECSTL circuits is the constant flow of current from the high voltage rail, $V_{EE}$, to ground. Applying the standard formula for power dissipation, P=IV, where P is power, I is current, and V is voltage, a conventional ECL gate dissipates about 50 μW [22]. Though the state of the various transistors within an ECL gate and the output voltage of the gate affect the current path within the gate circuit, the magnitude of the current within each gate is constant. The state of a logic gate therefore has minimal effect on its power dissipation.

The power dissipation mechanisms of ECSTL are identical to ECL; the constant current flow through the differential amplifiers and voltage followers constitute the primary source of dissipated power. This power dissipation is almost completely frequency-independent. In the logic family of the present invention, as well as conventional ECL, the power dissipation of a computing circuit is proportional to the number of logic stages. As noted in the multiplexer and adder circuits, this ECSTL family can execute logical functions using 20% to 30% of the number of devices required for conventional ECL while drawing the same amount of current per device. This implies a corresponding decrease in power dissipation of 70% to 80%.

The gate delay of ECSTL is determined by the switching time of the transistors within the gate. The high-speed ECL family from which it is derived has exceptional performance, with heterojunction bipolar transistors demonstrating functionality beyond 200 GHz [27]. The magnetic switching time is on the order of 1 ps [28]; the gate delay is therefore determined by the conventional electrical switching time of the transistors. The delay of a circuit is the summation of the delays of the individual stages, and is therefore proportional to the number of stages in the circuit. Due to the compact circuits possible with ECSTL, the number of stages required to perform a particular logical function is 3× to 5× fewer. There is therefore a proportional decrease in delay, showing the potential of this logic family for very high speed computing.

As with ECL, the area consumption of the ECSTL family is increased by the heavy use of resistors. However, the compact logic structures available with ECSTL mitigate this issue to some degree. An additional issue related to area, not present in ECL, is the size of the control wire structure and the distances between control wires. There is also a minimum distance by which spin-transistors will need to be separated in order to prevent unintended interactions between the magnetic field of a control wire and a neighboring spin-transistor.

As discussed in [16], the spin-transistor magnetoresistance is dependent on temperature. While the magnetoresistance is sufficient for room temperature logical functionality, the effect is stronger at lower temperatures. ECSTL can function from very low temperatures to temperatures slightly above room temperature, roughly 350 K. At lower temperatures, less current is required, leading to decreased power consumption.

In addition to being compact, this logic family can be cascaded for application to large computing systems and scaled to small dimensions without adverse effects. Scaling leads to substantial speed-up and decreased power dissipation, presenting the opportunity for large-scale adaptation of ECSTL. As the magnetic field created by the control wires is inversely proportional to the device size D, this technology is suitable for scaling. A constant I/D ratio produces a constant magnetic field, making it possible to decrease the current I, and therefore the power, with scaling. This behavior is in contrast to conventional circuit technologies based purely on electron charge, which are difficult to scale to ever smaller dimensions [29].

The match between the input and output voltage and field levels permit ECSTL circuits to be cascaded. The voltage nodes are connected directly from an output to an input without any concern regarding the flow of current from the output to the input. The voltage followers allow for a large fan-out of the voltage outputs, as in ECL. The fan-out characteristics of the current/field outputs are more complex: many inputs can be driven by a single current/field output and the maximum number is limited by the wire parasitic impedances. As the current/field output is a leg of the differential amplifier, the parasitic resistance of the wire should be deducted from the resistor value. Contemplation of the wire characteristics and routing is significantly more complex than in conventional logic families. The diverse set of input and output varieties, however, allows for highly flexible circuit design and therefore customized compact circuits.

The large gain of spin-transistors provides excellent noise tolerance. A small-to-moderate deviation from the correct input of a differential amplifier does not affect the current path, as the large gain ensures that a differential pnp transistor with a slightly lower base voltage or current/field draws the lion's share of the current. The output voltages of the logic gate will therefore be correct and unaffected by a noisy input. This noise attenuation exemplifies the strong signal integrity characteristics of ECSTL.

ECSTL is a spintronic logic family that makes effective use of the spin-degree of freedom for logical computing. Unlike other proposed spintronic logic families, this logic family has a clear method for cascading logic circuits in a manner that ensures signal integrity. Room temperature operation is also an important feature of ECSTL.

Given the 3× to 5× speedup and 70% to 80% decrease in power consumption, there is a 10× to 25× decrease in power-delay product as compared to ECL. ECL and ECSTL circuits dissipate minimal dynamic power, causing the power dissipation to be nearly independent of frequency. This behavior is in contrast to CMOS circuits, as depicted in FIG. 13, [30]. ECSTL has an equivalent power dissipation to CMOS at 10 GHz, a 50% decrease at 20 GHz, and a 75% decrease at 40 GHz. This greater than an order-of-magnitude improvement enhances the range of applications for which ECL-based logic is effective to provide a pathway for high-performance spintronic computing beyond 10 GHz.

While various embodiments of the present invention have been described, it will be apparent to those of skill in the art that many more embodiments and implementations are possible that are within the scope of this invention. Accordingly, the present invention is not to be restricted except in light of the attached claims and their equivalents.

LIST OF REFERENCES

[1] E. Y. Tsymbal and I. Zutic, Eds., *Handbook of spin transport and magnetism*. Boca Raton, Fla.: CRC Press, 2012.
[2] S. A. Wolf, J. Lu, M. R. Stan, E. Chen, and D. M. Treger, "The promise of nanomagnetics and spintronics for future logic and universal memory," *Proc. IEEE*, vol. 98, pp. 2155-2168, December 2010.

[3] J. S. Friedman, N. Rangaraju, Y. I. Ismail, B. W. Wessels, "A Spin-diode logic family," *IEEE Trans. Nanotechnology*, vol. 11, pp. 1026-1032, September 2012.

[4] S. Datta and B. Das, "Electronic analog of the electro-optic modulator," *Appl. Phys. Lett.*, vol. 56, pp. 665-667, February 1990.

[5] J. Shen, "Logic devices and circuits based on giant magnetoresistance," *IEEE Trans. Magnetics*, vol. 33, pp. 4492-4497, November 1997.

[6] A. Ney, C. Pampuch, R. Koch, and K. H. Ploog, "Programmable computing with a single magnetoresistive element," *Nature*, vol. 425, pp. 485-487, October 2003.

[7] J. S. Friedman, N. Rangaraju, Y. I. Ismail, B. W. Wessels, "InMnAs magnetoresistive spin-diode logic," *Proc. ACM Great Lakes Symposium on VLSI*, May 2012.

[8] S. S. P. Parkin et al., "Exchange-biased magnetic tunnel junctions and application to nonvolatile magnetic random access memory," *J. Appl. Phys.*, vol. 85, pp. 5828-5833, April 1999.

[9] R. P. Cowburn and M. E. Welland, "Room temperature magnetic quantum cellular automata," *Science*, vol. 287, pp. 1466-1468, February 2000.

[10] A. Imre, G. Csaba, L. Ji, A. Orlov, G. H. Bernstein, and W. Porod, "Majority logic gate for magnetic quantum-dot cellular automata," *Science*, vol. 311, pp. 205-208, January 2006.

[11] D. A. Allwood et al., "Magnetic domain-wall logic," *Science*, vol. 309, pp. 1688-1692, September 2005.

[12] H. Dery, P. Dalal, L. Cywinski, and L. J. Sham, "Spin-based logic in semiconductors for reconfigurable large-scale circuits," *Nature*, vol. 447, pp. 573-576, May 2007.

[13] A. Khitun, M. Bao, and K. L. Wang, "Spin wave magnetic nanofabric: a new approach to spin-based logic circuitry," *IEEE Trans. Magnetics*, vol. 44, pp. 2141-2152, September 2008.

[14] B. Behin-Aein, D. Datta, S. Salahuddin, and S. Datta, "Proposal for an all-spin logic device with built-in memory," *Nature Nanotechnology*, vol. 5, pp. 266-270, February 2010.

[15] C. Augustine, G. Panagopoulos, B. Behin-Aein, S. Srinivasan, A. Sarkar, and K. Roy, "Low-power functionality enhanced computation architecture using spin-based devices," *Proc. IEEE/ACM International Symposium on Nanoscale Architectures*, pp. 129-136, June 2011.

[16] N. Rangaraju, J. A. Peters, and B. W. Wessels, "Magnetoamplification in a bipolar magnetic junction transistor," *Phys. Rev. Lett.*, vol. 105, pp. 117202-1-4, September 2010.

[17] J. S. Friedman, Y. I. Ismail, G. Memik, A. V. Sahakian, and B. W. Wessels, "Emitter-coupled spin-transistor logic," *IEEE/ACM International Symposium on Nanoscale Architectures*, pp. 139-145, July 2012.

[18] J. A. Peters, N. Rangaraju, C. Feeser, and B. W. Wessels, "Spin-dependent magnetotransport in a p-InMnSb/n-InSb magnetic semiconductor heterojunction," *Appl. Phys. Lett.*, vol. 98, p. 193506, May 2011.

[19] J. Fabian, I. Zutic, S. D. Sarma, "Magnetic bipolar transistor," *Appl. Phys. Lett.*, vol. 84, pp. 85-87, January 2004.

[20] K. L. Averett, X. Wu, M. W. Koch, G. W. Wicks, "InAs-based heterojunction bipolar transistors," *Electronics Letters*, vol. 38, pp. 344-346, March 2002.

[21] J. Millman, Microelectronics: Digital and Analog Circuits and Systems. New York: McGraw-Hill, 1979.

[22] ON Semiconductor, "NBSG86A," March 2012.

[23] L. W. Nagel and D. O. Pederson, SPICE (*Simulation Program with Integrated Circuit Emphasis*), Memorandum No. ERL-M382, University of California, Berkeley, April 1973.

[24] J. E. Ayers, Digital Integrated Circuits: Analysis and Design. Boca Raton, Fla.: CRC Press, 2003.

[25] J. Millman, Microelectronics: Digital and Analog Circuits and Systems. New York: McGraw-Hill, 1979.

[26] S. K. Banerjee, L. F. Register, E. Tutuc, D. Basu, S. Kim, D. Reddy, and A. H. MacDonald, "Graphene for CMOS and beyond CMOS applications," *Proc. IEEE*, vol. 98, pp. 2033-2046, December 2010.

[27] G. Freeman, B. Jagannathan, S.-J. Jeng, J.-S. Rieh, A. D. Stricker, D. C. Ahlgren, and S. Subbanna, "Transistor design and application considerations for >200-GHz SiGe HBTs," *IEEE Trans. Electron Devices*, vol. 50, pp. 645-655, March 2003.

[28] M. Bhowmick, T. R. Merritt, K. Nontapot, B. W. Wessels, O. Drachenko, and G. A. Khodaparast, "Time-resolved spectroscopy of InMnAs using differential transmission techniques in mid-infrared," *Physics Procedia*, vol. 3, pp. 1167-1170, January 2010.

[29] D. J. Frank, R. H. Dennard, E. Nowak, P. M. Solomon, Y. Taur, and H.-S. P. Wong, "Device scaling limits of Si MOSFETs and their application dependencies," *Proc. IEEE*, vol. 89, pp. 259-288, March 2001.

[30] International Technology Roadmap for Semiconductors, SEMATECH, 2011.

What is claimed is:

1. A logic circuit, comprising:
a spin-transistor having an emitter, a collector and a base;
a first control wire for receiving an input current to create a magnetic field that affects amplification of the spin-transistor;
a first resistor between the spin-transistor collector and one of a low voltage source and a high voltage source;
a second transistor having an emitter, a collector and a base, wherein the emitter of the second transistor is coupled to the emitter of the spin-transistor;
a second resistor between the second transistor collector and the one of the low voltage source and the high voltage source; and
a third resistor between the spin-transistor emitter and the other of the low voltage source and the high voltage source.

2. The logic circuit of claim 1, wherein the second transistor comprises a second spin-transistor and a second control wire for receiving a second current to create a magnetic field that affects amplification of the second spin-transistor.

3. The logic circuit of claim 1, further comprising:
a third transistor having an emitter, a collector and a base; and
a fourth resistor between the third transistor collector and the one of the low voltage source and the high voltage source, wherein the current through the fourth resistor feeds the first control wire.

4. The logic circuit of claim 3, wherein the third transistor comprises a spin-transistor.

5. The logic circuit of claim 1, further comprising a shield to concentrate the magnetic field through the spin-transistor.

6. The logic circuit of claim 1, wherein the spin-transistor comprises any electrical device with amplification affected by applied magnetic field, such as a pnp bipolar junction transistor, npn bipolar junction transistor, n-type metal-oxide-semiconductor field-effect transistor (MOSFET), or p-type MOSFET.

7. The logic circuit of claim 1, wherein the spin-transistor has either a positive magnetoresistance or a negative magnetoresistance, and is either ferromagnetic/non-volatile or paramagnetic/volatile.

8. The logic circuit of claim 1, further comprising a voltage follower connected to an output of the logic circuit.

9. An inverter/buffer comprising the logic circuit of claim 1.

10. A full adder comprising the logic circuit of claim 1.

11. A 2:1 multiplexer comprising the logic circuit of claim 1.

12. A 4:1 multiplexer comprising the logic circuit of claim 1.

13. The logic circuit of claim 1, where the first control wire comprises multiple control wires.

14. A logic circuit, comprising:
   a first spin-transistor having an emitter, a collector and a base;
   a first control wire for receiving an input current to create a magnetic field that affects amplification of the first spin-transistor;
   a first resistor between the first spin-transistor collector and one of a low voltage source and a high voltage source;
   a second spin-transistor having an emitter, a collector and a base, wherein the emitter of the second spin-transistor is coupled to the emitter of the first spin-transistor;
   a second control wire for receiving an input current to create a magnetic field that affects amplification of the second spin-transistor;
   a second resistor between the second spin-transistor collector and the one of the low voltage source and the high voltage source;
   a third resistor between the first spin-transistor emitter and the other of the low voltage source and the high voltage source; and
   a third transistor having an emitter, a collector and a base; and
   a fourth resistor between the third transistor collector and the one of the low voltage source and the high voltage source, wherein the current through the fourth resistor feeds the second control wire for the second spin-transistor.

15. The logic circuit of claim 14, where one or both of the first control wire and the second control wire comprises multiple control wires.

16. The logic circuit of claim 14, further comprising multiple input circuits connected with the first spin-transistor, comprising:
   an additional spin-transistor having an emitter, a collector and a base, wherein the emitter of the additional spin-transistor is coupled to the emitter of the first spin-transistor;
   an additional control wire for receiving an input current to create a magnetic field that affects amplification of the additional spin-transistor; and
   an additional resistor between the additional spin-transistor collector and the one of the low voltage source and the high voltage source.

17. A full adder comprising the logic circuit of claim 14.

18. A 2:1 multiplexer comprising the logic circuit of claim 14.

19. A 4:1 multiplexer comprising the logic circuit of claim 14.

20. The logic circuit of claim 14, further comprising a shield to concentrate the magnetic field through the first spin-transistor.

* * * * *